United States Patent
Yoo et al.

(10) Patent No.: US 10,665,820 B2
(45) Date of Patent: May 26, 2020

(54) DISPLAY DEVICE

(71) Applicant: LG Display Co., Ltd., Seoul (KR)

(72) Inventors: Donghee Yoo, Paju-si (KR); Taehan Park, Paju-si (KR); Kyunghoon Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/993,278

(22) Filed: May 30, 2018

(65) Prior Publication Data
US 2018/0351133 A1  Dec. 6, 2018

(30) Foreign Application Priority Data
May 31, 2017  (KR) .................. 10-2017-0067811

(51) Int. Cl.
*H01L 35/24* (2006.01)
*H01L 51/52* (2006.01)
*H01L 27/32* (2006.01)

(52) U.S. Cl.
CPC ...... *H01L 51/5275* (2013.01); *H01L 27/3272* (2013.01); *H01L 2251/5338* (2013.01)

(58) Field of Classification Search
CPC .................. H01L 27/3272; H01L 51/5275
See application file for complete search history.

(56) References Cited

U.S. PATENT DOCUMENTS

| 2014/0034919 A1* | 2/2014 | Park ................... H01L 51/5275 257/40 |
| 2016/0301034 A1* | 10/2016 | Hsu .................... H01L 51/5275 |

FOREIGN PATENT DOCUMENTS

KR  10-2016-0056598 A  5/2016

* cited by examiner

*Primary Examiner* — Samuel A Gebremariam
(74) *Attorney, Agent, or Firm* — Fenwick & West LLP

(57) ABSTRACT

A display device for improving an outcoupling efficiency of emitted light is disclosed. The display device includes a substrate, a subpixel arranged on the substrate, the subpixel including an organic light emitting diode having an emission portion that emits light, a first passivation layer disposed on the organic light emitting diode, at least one lens positioned on the first passivation layer, the at least one lens disposed in a position corresponding to the emission portion of the organic light emitting diode, a cover layer covering the at least one lens, and a second passivation layer disposed on the cover layer. A refractive index of the at least one lens is greater than a refractive index of the cover layer.

27 Claims, 15 Drawing Sheets

(a)  (b)

(a)  (b)

(a)  (b)

DISPLAY DEVICE

CROSS-REFERENCE TO RELATED APPLICATIONS

This application claims the priority benefit of Republic of Korea Patent Application No. 10-2017-0067811 filed on May 31, 2017, which are incorporated herein by reference in its entirety.

BACKGROUND

Field of Technology

The present disclosure relates to a display device, and more particularly to a display device for improving an outcoupling efficiency of emitted light.

Discussion of the Related Art

With the development of information society, demands for display devices displaying an image are increasing in various ways. In the field of display devices, a large-sized cathode ray tube (CRT) has been rapidly replaced by a flat panel display (FPD) having advantages of a thin profile, light weight, and a large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display can be manufactured on a flexible plastic substrate. In addition, the OLED display has advantages of a lower driving voltage, lower power consumption, and better color tone as compared to a plasma display panel or an inorganic electroluminescent display.

The OLED display is roughly classified into a top emission OLED display and a bottom emission OLED display depending on an emission direction of light emitted from an emission layer.

In the bottom emission OLED display, light emitted from an emission layer is emitted toward a substrate on which a thin film transistor for driving an element is formed. On the other hand, in the top emission OLED display, light emitted from an emission layer is emitted toward a position opposite a substrate on which a thin film transistor for driving an element is formed. To this end, the top emission OLED display includes a reflective electrode as an anode and a transmissive electrode capable of transmitting light as a cathode. Thus, light emitted from the emission layer is reflected from the reflective electrode and is emitted to the transmissive electrode. In this instance, light emitted from the emission layer may be totally reflected to the inside of the OLED display duet to a difference in a refractive index between the cathode having a high refractive index and a structure (for example, a passivation layer) on the cathode. The light totally reflected to the inside of the OLED display is trapped inside the OLED display, and thus an outcoupling efficiency of the OLED display is reduced.

Accordingly, studies are being actively carried out to more efficiently extract light emitted from the OLED display for the improvement of the outcoupling efficiency.

SUMMARY

The present disclosure provides a display device capable of improving an outcoupling efficiency of emitted light.

In one embodiment, a display device comprises: a substrate; a subpixel arranged on the substrate, the subpixel including an organic light emitting diode having an emission portion that emits light; a first passivation layer disposed on the organic light emitting diode; at least one lens positioned on the first passivation layer, the at least one lens disposed in a position corresponding to the emission portion of the organic light emitting diode; a cover layer covering the at least one lens; and a second passivation layer disposed on the cover layer.

In another embodiment, a display device comprises: a substrate; a subpixel arranged on the substrate, the subpixel including an organic light emitting diode having an emission portion that emits light; at least one lens positioned on the organic light emitting diode, the at least one lens entirely overlapping the emission portion in its entirety; and a first cover layer on the at least one lens.

In another embodiment, a display device comprises: a plurality of pixels that each include a plurality of sub-pixels, each of the plurality of sub-pixels of at least one pixel including; an emission portion that emits light; and at least one lens that overlaps the emission portion and comprises a diameter that is at least as wide as width of the emission portion.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the disclosure. Names of the respective elements used in the following explanations are selected only for convenience of writing the specification and may be thus different from those used in actual products. In the description of positional relationships, when a structure is described as being positioned "on or above", "under or below", "next to" another structure, this description should be construed as including a case in which the structures directly contact each other as well as a case in which a third structure is disposed therebetween.

A display device according to embodiments of the disclosure is a plastic display device, in which a display element is formed on a flexible plastic substrate. Examples of the plastic display device include an organic light emitting diode (OLED) display, a liquid crystal display (LCD), and an electrophoresis display. Embodiments are described using the OLED display by way of example. An OLED display includes an emission layer, that is formed of an organic material, between a first electrode serving as an anode and a second electrode serving as a cathode. The OLED display is a self-emission display device configured to form hole-electron pairs, i.e., excitons, by combining holes received from the first electrode and electrons received from the second electrode inside the emission layer and emit light by energy generated when the excitons return to a ground level. The OLED display according to embodiments of the disclosure may alternatively use a glass substrate rather than the plastic substrate.

In embodiments disclosed herein, pixels of the display device are roughly arranged in a stripe format and a pentile format. In the stripe format, subpixels RGB or RGBW form a unit pixel, and unit pixels are arranged in the stripe format. In the pentile format, subpixels RG and subpixels BG each form a unit pixel, and unit pixels of the subpixels RG and BG are alternately arranged. Embodiments of the disclosure describe pentile pixels by way of example, but are not limited thereto. Embodiments of the disclosure may use pixels arranged in the stripe format.

Embodiments of the disclosure are described below with reference to FIGS. 1 to 18.

Figure 1:
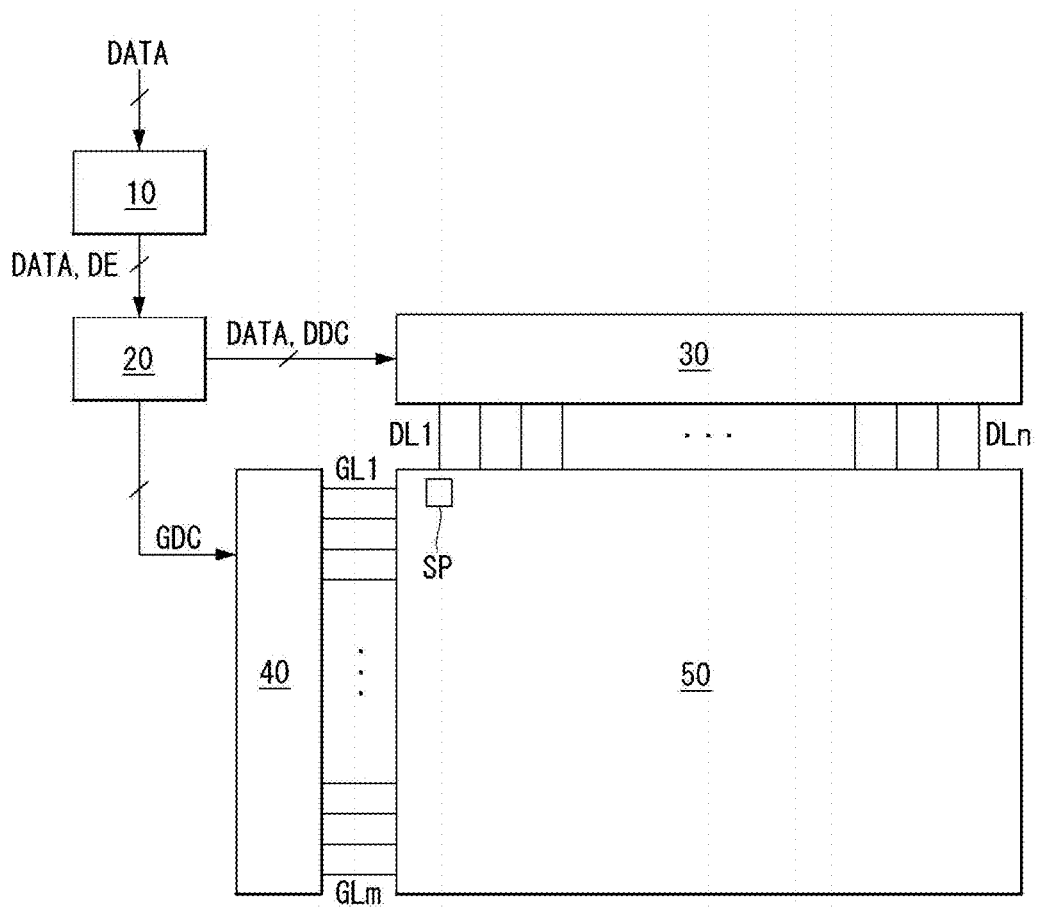
FIG. 1 is a schematic block diagram of an organic light emitting diode (OLED) display according to an embodiment of the disclosure.
Figure 2:
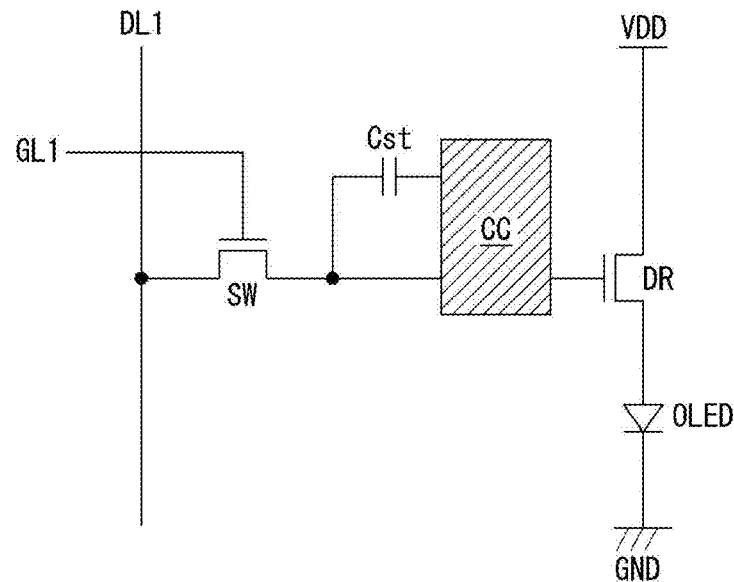
FIG. 2 illustrates a first example of a circuit configuration of a subpixel according to an embodiment of the disclosure.
Figure 3:
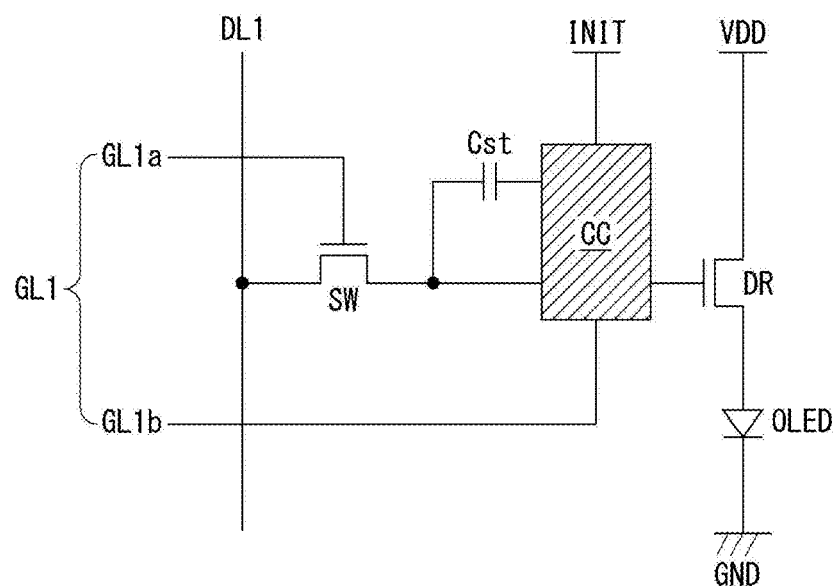
FIG. 3 illustrates a second example of a circuit configuration of a subpixel according to an embodiment of the disclosure.

FIG. 1 is a schematic block diagram of an OLED display according to an embodiment of the disclosure. FIG. 2 illustrates a first example of a circuit configuration of a subpixel according to an embodiment of the disclosure. FIG. 3 illustrates a second example of a circuit configuration of a subpixel according to an embodiment of the disclosure.

Referring to FIG. 1, an OLED display according to an embodiment of the disclosure includes an image processing unit 10, a timing controller 20, a data driver 30, a gate driver 40, and a display panel 50.

The image processing unit 10 outputs a data signal DATA and a data enable signal DE supplied from the outside. The image processing unit 10 may output one or more of a vertical sync signal, a horizontal sync signal, and a clock signal in addition to the data enable signal DE. For the sake of brevity and ease of reading, these signals are not shown. The image processing unit 10 may be formed on a system circuit board in an integrated circuit (IC) form.

The timing controller 20 receives the data signal DATA and driving signals including the data enable signal DE or the vertical sync signal, the horizontal sync signal, the clock signal, etc. from the image processing unit 10.

The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board in an IC form.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 may be formed on a gate circuit board in an IC form, or may be formed on the display panel 50 in a gate-in panel (GIP) manner.

The display panel 50 displays an image in response to the data signal DATA and the gate signal respectively received from the data driver 30 and the gate driver 40. The display panel 50 includes subpixels SP displaying an image.

Referring to FIG. 2, each subpixel may includes a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor Cst as a data voltage in response to a gate signal supplied through a first gate line GL1. The driving transistor DR enables a driving current to flow between a high potential power line VDD and a low potential power line GND based on the data voltage stored in the capacitor Cst. The compensation circuit CC is a circuit for compensating for a threshold voltage of the driving transistor DR. The capacitor Cst connected to the switching transistor SW or the driving transistor DR may be mounted inside the compensation circuit CC.

The compensation circuit CC includes one or more thin film transistors (TFTs) and a capacitor. Configuration of the compensation circuit CC may be variously changed depending on a compensation method. A brief description of the compensation circuit CC will be made.

As shown in FIG. 3, the subpixel including the compensation circuit CC may further include a signal line and a power line for driving a compensation TFT and supplying a predetermined signal or electric power. The added signal line may be defined as a 1-2 gate line GL1*b* for driving the compensation TFT included in the subpixel. In FIG. 3, "GL1*a*" is a 1-1 gate line for driving the switching transistor SW. The added power line may be defined as an initialization power line INIT for initializing a predetermined node of the subpixel at a predetermined voltage. However, embodiments are not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like.

Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

A cross-sectional structure of a subpixel SP of an OLED display according to an embodiment of the disclosure is described below with reference to FIG. 4.

Figure 4:
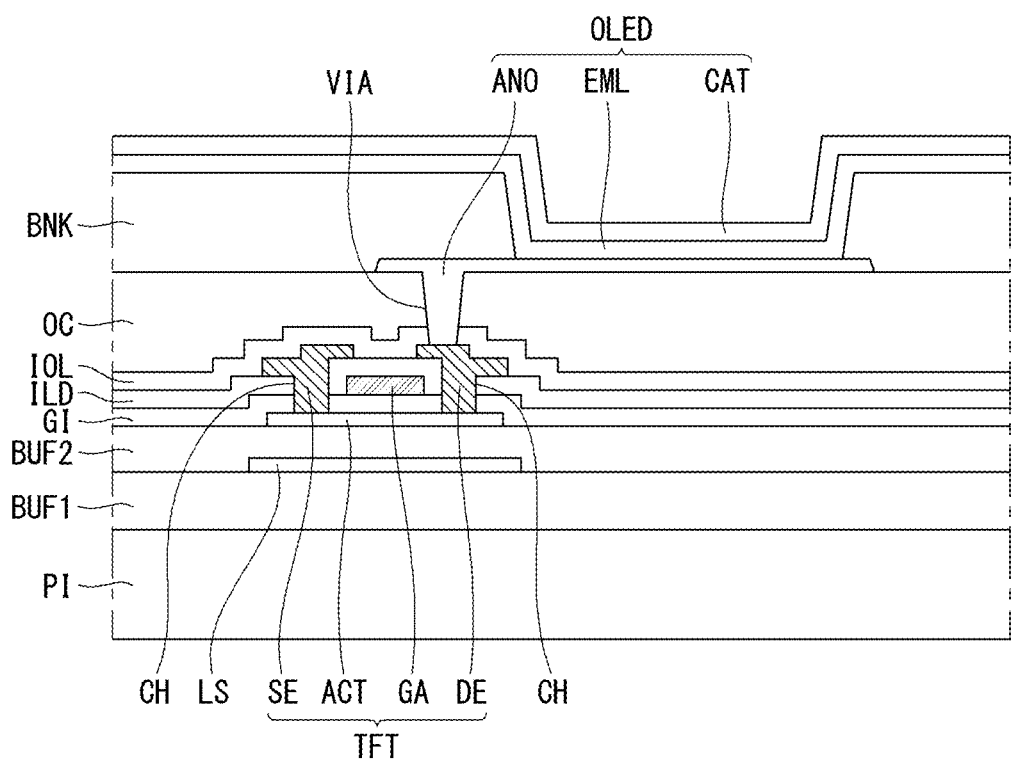
FIG. 4 is a cross-sectional view illustrating a subpixel of an OLED display according to an embodiment of the disclosure.

As shown in FIG. 4, in an OLED display according to an embodiment of the disclosure, a first buffer layer BUF1 is positioned on a substrate PI. The substrate PI may be formed of plastic and may be, for example, a polyimide. Thus, the substrate PI according to the embodiment of the disclosure may have flexible characteristics. The first buffer layer BUF1 protects a thin film transistor formed in a subsequent process from impurities, for example, alkali ions discharged from the substrate PI. The first buffer layer BUF1 may be formed of a silicon oxide (SiOx) layer, a silicon nitride (SiNx) layer, or a multilayer thereof.

A shield layer LS is positioned on the first buffer layer BUF1. The shield layer LS prevents a reduction in a panel driving current which may be generated by using a polyimide substrate. A second buffer BUF2 is positioned on the shield layer LS. The second buffer BUF2 protects a thin film transistor formed in a subsequent process from impurities, for example, alkali ions discharged from the shield layer LS. The second buffer layer BUF2 may be formed of a silicon oxide (SiOx) layer, a silicon nitride (SiNx) layer, or a multilayer thereof.

An active layer ACT is positioned on the second buffer layer BUF2 and may be formed of a silicon semiconductor or an oxide semiconductor. The silicon semiconductor may include amorphous silicon or crystallized polycrystalline silicon. The polycrystalline silicon has high mobility (for example, more than 100 cm$^2$/Vs), low power consumption, and excellent reliability. Thus, the polycrystalline silicon can be applied to a gate driver and/or a multiplexer (MUX) for use in a driving element or applied for a driving TFT of each pixel of the OLED display. Because the oxide semiconductor has a low OFF-current, the oxide semiconductor is suitable for a switching TFT which has a short ON-time and a long OFF-time. Further, because the oxide semiconductor increases a voltage hold time of the pixel due to the low OFF-current, the oxide semiconductor is suitable for a display device requiring a low-speed drive and/or low power consumption. In addition, the active layer ACT includes a drain region and a source region each including p-type or n-type impurities, and also includes a channel region between the drain region and the source region.

A gate insulating layer GI is positioned on the active layer ACT and may be formed of a silicon oxide (SiOx) layer, a silicon nitride (SiNx) layer, or a multilayer thereof. A gate electrode GA is positioned on the gate insulating layer GI at a location corresponding to a predetermined region (i.e., the channel region when impurities are injected) of the active layer ACT. The gate electrode GA may be formed of one of molybdenum (Mo), aluminum (Al), chrome (Cr), gold (Au), titanium (Ti), nickel (Ni), neodymium (Nd), copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), copper (Cu), or a combination thereof. For example, the gate electrode GA may be formed as a double layer of Mo/AlNd or Mo/Al.

An interlayer dielectric layer ILD is positioned on the gate electrode GA and insulates the gate electrode GA. The interlayer dielectric layer ILD may be formed of a silicon oxide (SiOx) layer, a silicon nitride (SiNx) layer, or a multilayer thereof. Contact holes CH exposing a portion of the active layer ACT are formed at a portion where each of the interlayer dielectric layer ILD and the gate insulating layer GI is formed.

A drain electrode DE and a source electrode SE are positioned on the interlayer dielectric layer ILD. The drain electrode DE is connected to the active layer ACT through the contact hole CH exposing the drain region of the active layer ACT, and the source electrode SE is connected to the active layer ACT through the contact hole CH exposing the source region of the active layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al-Nd/Mo.

Accordingly, a thin film transistor TFT including the active layer ACT, the gate electrode GA, the source electrode SE, and the drain electrode DE is formed.

Further, an inorganic layer IOL is positioned on the substrate PI including the thin film transistor TFT. The inorganic layer IOL is an insulating layer protecting the component underlying the inorganic layer IOL and may be a silicon oxide (SiOx) layer, a silicon nitride (SiNx) layer, or a multilayer thereof. An overcoat layer OC is positioned on the inorganic layer IOL. The overcoat layer OC may be a planarization layer for reducing a height difference of an underlying structure and may be formed of an organic material such as polyimide, benzocyclobutene-based resin, and acrylate. For example, the overcoat layer OC may be formed through a spin-on glass (SOG) method for coating the organic material in a liquid state and then curing the organic material.

A via hole VIA exposing the drain electrode DE of the thin film transistor TFT is positioned in a portion of the overcoat layer OC. An organic light emitting diode OLED is positioned on the overcoat layer OC. More specifically, a first electrode ANO is positioned on the overcoat layer OC. The first electrode ANO serves as a pixel electrode and is connected to the drain electrode DE of the thin film transistor TFT through the via hole VIA. The first electrode ANO is an anode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd) or a combination thereof. For example, the reflective layer may be formed of an Ag/Pd/Cu (APC) alloy.

In addition, a bank layer BNK defining pixels is positioned on the substrate PI including the first electrode ANO. The bank layer BNK may be formed of an organic material such as polyimide, benzocyclobutene-based resin, and acrylate. The bank layer BNK includes a pixel definition portion exposing the first electrode ANO. An emission layer EML contacting the first electrode ANO is positioned in the pixel definition portion of the bank layer BNK. The emission layer EML at least includes a layer in which electrons and holes combine and emit light. A hole injection layer and/or a hole transport layer may be positioned between the emission layer EML and the first electrode ANO, and an electron injection layer and/or an electron transport layer may be positioned between the emission layer EML and a second electrode CAT.

The second electrode CAT is positioned on the emission layer EML and may be positioned on an entire surface of a display area. In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

The OLED display according to embodiments of the disclosure may include a lens on a path of light emitted from an emission layer, in order to prevent light emitted from the emission layer from being damaged by total reflection of the light. In the following description, a description of the components below the organic light emitting diode shown in FIG. 4 is omitted, and configuration of the components on the organic light emitting diode is described in detail.

First Embodiment

Figure 5:
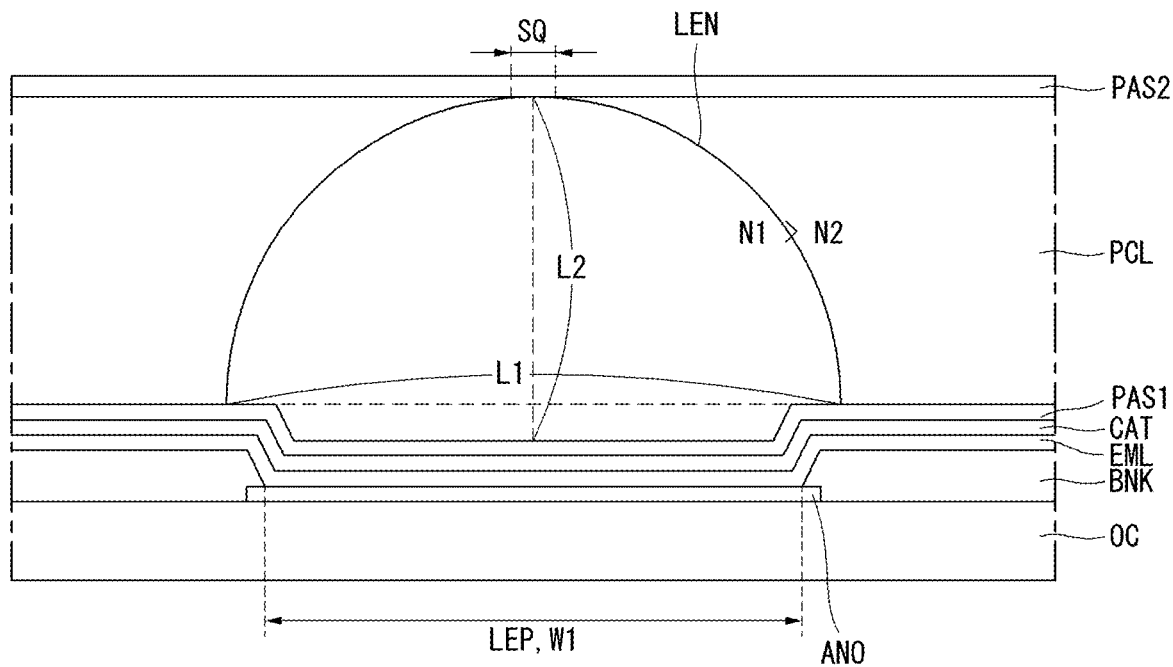
FIG. 5 is a cross-sectional view of an OLED display according to a first embodiment of the disclosure.
Figure 6:
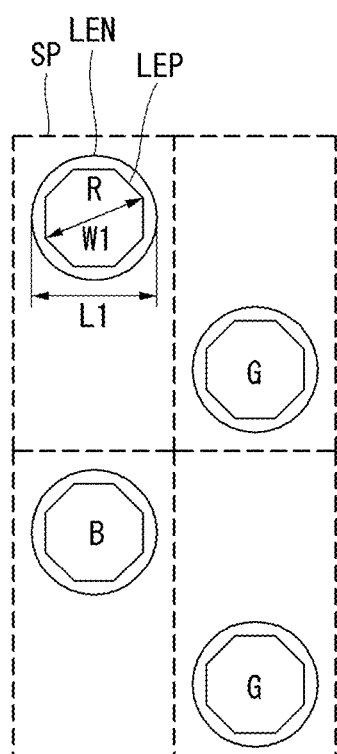
FIG. 6 is a plan view of an OLED display according to the first embodiment of the disclosure.
Figure 6:
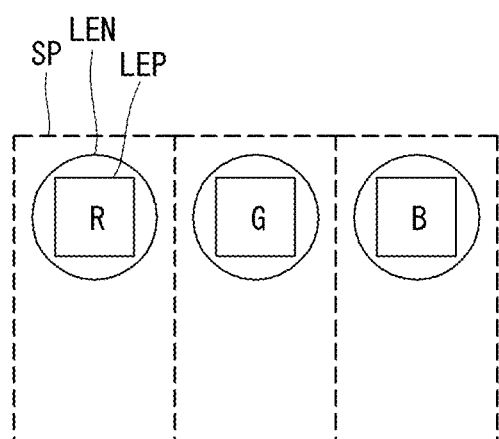

FIG. 5 is a cross-sectional view of an OLED display according to a first embodiment of the disclosure. FIG. 6 is a plan view of an OLED display according to the first embodiment of the disclosure.

Referring to FIG. 5, an OLED display according to a first embodiment of the disclosure forms a first passivation layer PAS1 on an organic light emitting diode to protect the organic light emitting diode from a subsequent process or moisture. The OLED display includes a lens LEN on the first passivation layer PAS1, and the lens LEN can upwardly concentrate a light path. The lens LEN will be described in detail later. A cover layer PCL is positioned on the first passivation layer PAS1 including the lens LEN. The cover layer PCL functions to make up for a height difference of an underlying structure. For example, the cover layer PCL can make up for a height difference resulting from the lens LEN or foreign substances which may be present. The cover layer PCL may have a thickness of 5 μm to 20 μm capable of making up for the height difference. The cover layer PCL may be formed of the same organic material as a bank layer BNK described above. A second passivation layer PAS2 is disposed on the cover layer PCL and protects an underlying structure.

The lens LEN is disposed corresponding to an emission portion LEP of the organic light emitting diode. The emission portion LEP of the organic light emitting diode is an area where light is emitted from an emission layer EML. More specifically, the emission portion LEP may be an area where a first electrode ANO and the emission layer EML contact each other. The lens LEN is disposed to entirely cover the emission portion LEP of the organic light emitting diode. Further, the lens LEN is configured such that all of light emitted from the emission portion LEP can be received inside the lens LEN.

(a) of FIG. 6 illustrates that R, G, B and G subpixels SP are arranged in a pentile format, and (b) of FIG. 6 illustrates that R, G and B subpixels SP are arranged in a stripe format. As described above, the lens LEN according to the embodiment of the disclosure may be disposed to entirely cover an emission portion LEP of each subpixel SP. More specifically, the lenses LEN respectively correspond to the emission portions LEP of the subpixels SP, and thus one lens LEN is disposed to cover an emission portion LEP of one subpixel SP. The lens LEN does not invade other subpixel SP adjacent to the lens LEN, and the lenses LEN are spaced from one another. In some embodiments, the shape of the emission portion LEP is a polygon, and the shape of the lens LEN is a circle.

Referring again to FIG. 5, the lens LEN according to the embodiment of the disclosure has enough size to cover the emission portion LEP. More specifically, a diameter L1 of the lens LEN is greater than a width W1 of the emission portion LEP, and thus the lens LEN can entirely cover the emission portion LEP. In embodiments disclosed herein, the width W1 of the emission portion LEP indicates a maximum width of the emission portion LEP.

A height L2 of the lens LEN is equal to or less than the diameter L1 of the lens LEN. More specifically, the height L2 of the lens LEN is 0.3 to 1 times the diameter L1 of the lens LEN. When the height L2 of the lens LEN is more than 0.3 times the diameter L1 of the lens LEN, a curved angle of the lens LEN increases. Hence, an outcoupling efficiency can be improved by upwardly concentrating light. Further, when the height L2 of the lens LEN is less than 1 times the diameter L1 of the lens LEN, a manufacturing process can be prevented from being difficult due to an excessive increase in the height L2 of the lens LEN. In particular, when a ratio of the height L2 of the lens LEN to the diameter L1 of the lens LEN is 0.5:1, an effect of the lens LEN may be the most effective. For example, the diameter L1 of the lens LEN according to the embodiment of the disclosure may be 10 μm to 30 μm, and the height L2 of the lens LEN may be 3 μm to 30 μm.

The embodiment of the disclosure differently sets a refractive index of the lens LEN and a refractive index of the cover layer PCL, in order to change a light path at an interface between the lens LEN and the cover layer PCL. Light emitted from the emission layer EML is incident on the lens LEN and is refracted at the interface between the lens LEN and the cover layer PCL due to a difference between the refractive index of the lens LEN and the refractive index of the cover layer PCL. Hence, a path of the light emitted from the emission layer EML is changed. In embodiments disclosed herein, a refractive index N1 of the lens LEN may be set to be greater than a refractive index N2 of the cover layer PCL. For example, the refractive index N1 of the lens LEN may be greater than the refractive index N2 of the cover layer PCL by 0.1 to 1. When the refractive index N1 of the lens LEN is greater than the refractive index N2 of the cover layer PCL by 0.1 or more, light can be refracted at the interface between the lens LEN and the cover layer PCL and can be upwardly concentrated. Hence, the outcoupling efficiency can be improved. Further, when the refractive index N1 of the lens LEN is greater than the refractive index N2 of the cover layer PCL by 1 or less, light can be prevented from being excessively refracted at the interface between the lens LEN and the cover layer PCL and being lost at the side. For example, the refractive index N1 of the lens LEN may be 1.73, and the refractive index N2 of the cover layer PCL may be 1.52.

The lens LEN according to the embodiment of the disclosure is disposed adjacent to the emission layer EML. A second electrode CAT contacting the emission layer EML and the first passivation layer PAS1 contacting the second electrode CAT are disposed between the emission layer EML and the lens LEN. The lens LEN is disposed on the first passivation layer PAS1 and contacts the first passivation layer PAS1.

Light emitted from the emission layer EML may be considerably lost between the emission layer EML and the second electrode CAT and between the second electrode CAT and the first passivation layer PAS1. Thus, the embodiment of the disclosure can reduce a loss of emitted light by disposing the lens LEN as close as possible to the emission layer EML. To this end, a distance between an upper surface of the emission layer EML and a lower surface of the lens LEN may be 100 nm to 10,000 nm. The distance between the upper surface of the emission layer EML and the lower surface of the lens LEN may be substantially equal to a sum of thicknesses of the second electrode CAT and the first passivation layer PAS1. When the distance between the upper surface of the emission layer EML and the lower surface of the lens LEN is equal to or greater than 100 nm, each of the second electrode CAT and the first passivation layer PAS1 between the emission layer EML and the lens LEN can have a thickness that facilitates performing a function. Further, when the distance between the upper surface of the emission layer EML and the lower surface of the lens LEN is equal to or less than 10,000 nm, light can be prevented from being lost due to a very long distance between the emission layer EML and the lens LEN. More preferably, but not required, the distance between the upper surface of the emission layer EML and the lower surface of the lens LEN may be 500 nm to 2,000 nm. Hence, the embodiment of the disclosure can prevent a loss of light emitted from the emission layer EML.

A portion of the lens LEN contacts the second passivation layer PAS2. As shown in FIG. 5, a portion of an upper surface of the lens LEN may contact the second passivation layer PAS2. A contact area SQ between the lens LEN and the second passivation layer PAS2 is an area on which light emitted from the emission layer EML is vertically incident. If a passivation layer, has a large difference in a refractive index between the passivation layer and the lens LEN, is formed in the contact area SQ, light is again reflected in an incident direction and is hardly extracted to the outside. Thus, the lens LEN contacts the second passivation layer PAS2 having a refractive index similar to the refractive index of the lens LEN in the contact area SQ and thus can transmit light. To this end, a difference in the refractive index between the lens LEN and the second passivation layer PAS2 may be less than 0.3. Although an occupation rate of each subpixel occupied by the contact area SQ between the lens LEN and the second passivation layer PAS2 is not large, the occupation rate in all the subpixels included in the OLED display is not small. Thus, the contact area SQ can greatly contribute to the improvement of the outcoupling efficiency.

As described above, the OLED display according to the first embodiment of the disclosure includes the lens LEN corresponding to the emission portion LEP on the organic light emitting diode and upwardly refracts light emitted from the emission layer EML through the lens LEN, thereby improving the outcoupling efficiency.

Second Embodiment

Figure 7:
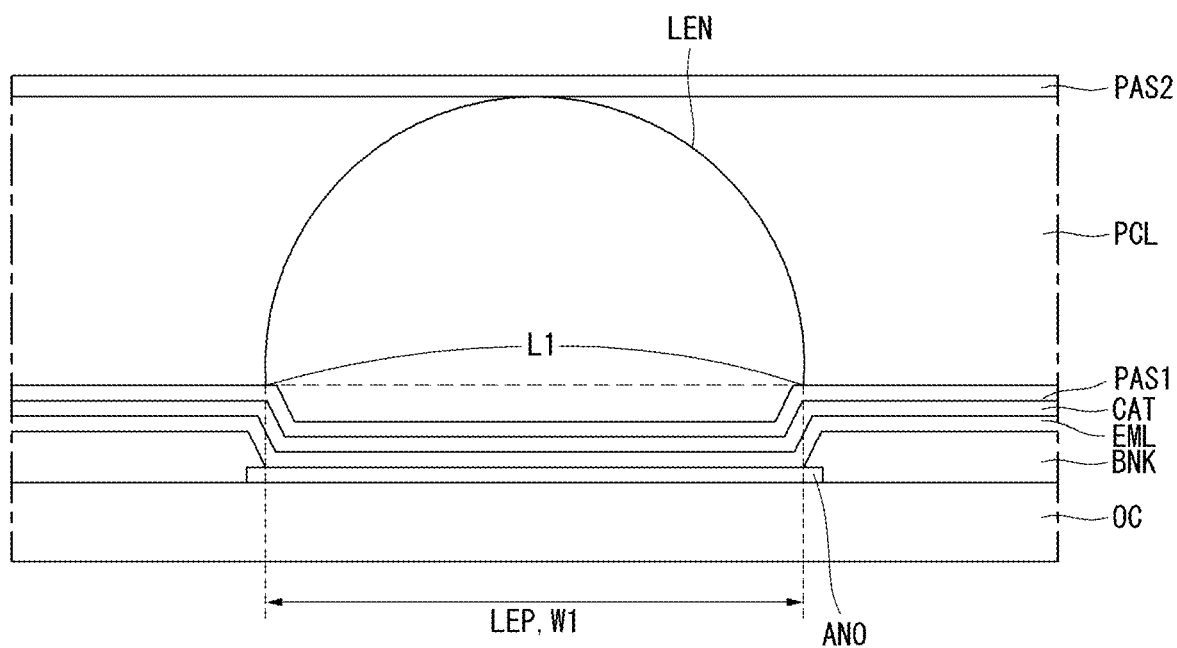
FIG. 7 is a cross-sectional view of an OLED display according to a second embodiment of the disclosure.
Figure 8:
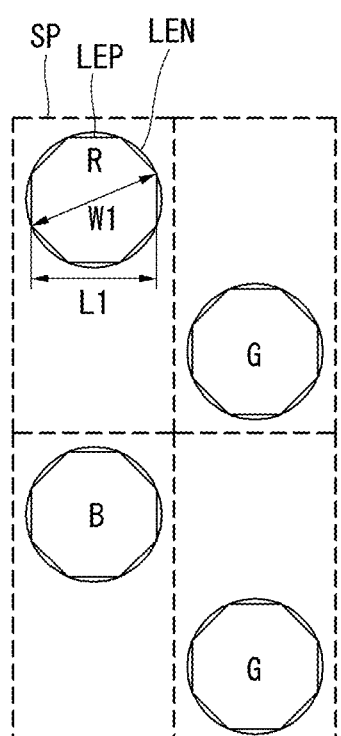
FIG. 8 is a plan view of an OLED display according to the second embodiment of the disclosure.
Figure 8:
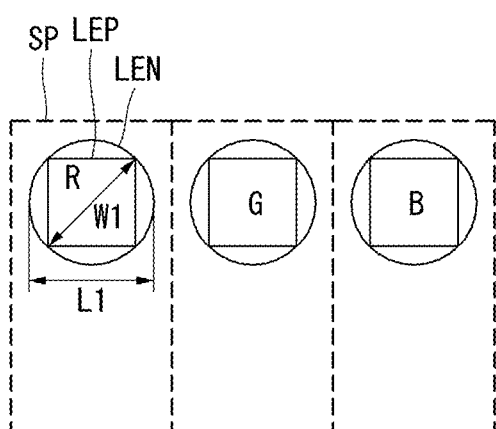
Figure 9:
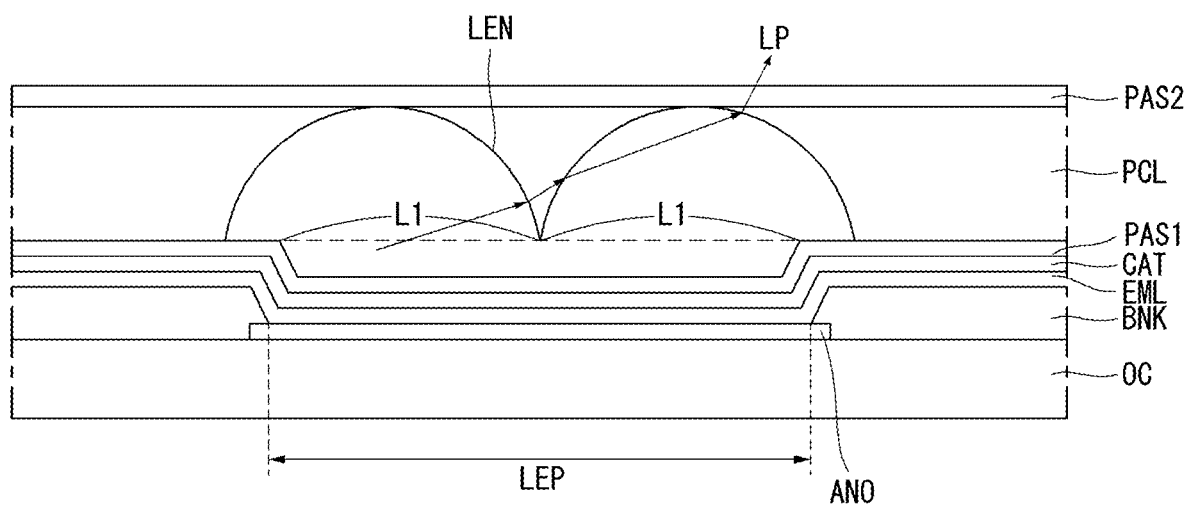
FIG. 9 is a cross-sectional view illustrating another configuration of an OLED display according to the second embodiment of the disclosure.
Figure 10:
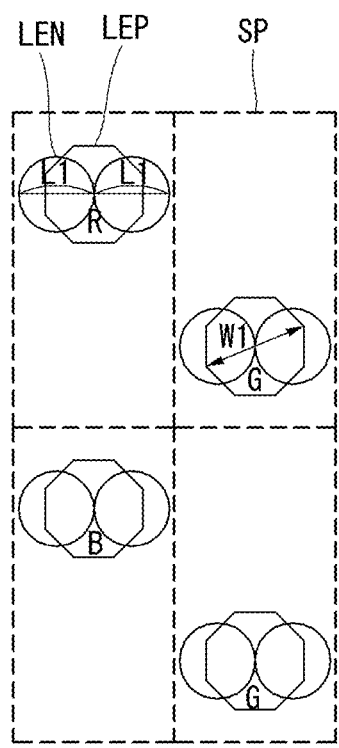
FIG. 10 is a plan view illustrating another configuration of an OLED display according to the second embodiment of the disclosure.
Figure 10:
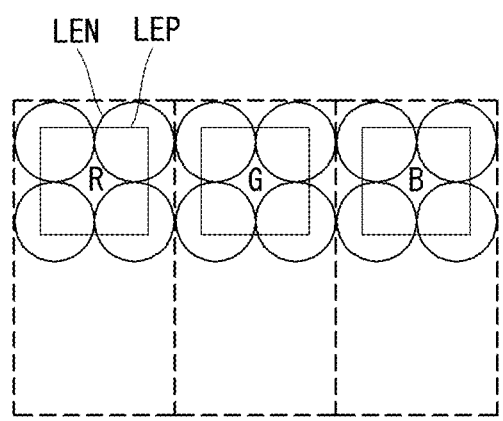

FIG. 7 is a cross-sectional view of an OLED display according to a second embodiment of the disclosure. FIG. 8 is a plan view of an OLED display according to the second embodiment of the disclosure. FIG. 9 is a cross-sectional view illustrating another configuration of an OLED display according to the second embodiment of the disclosure. FIG. 10 is a plan view illustrating another configuration of an OLED display according to the second embodiment of the disclosure.

Referring to FIGS. 7 and 8, an OLED display according to a second embodiment of the disclosure includes a lens LEN on a first passivation layer PAS1, and the lens LEN can upwardly concentrate a light path. The lens LEN is disposed corresponding to an emission portion LEP of an organic light emitting diode and covers the emission portion LEP of the organic light emitting diode. In this instance, a diameter L1 of the lens LEN may be substantially equal to a width W1 of the emission portion LEP. Thus, because the lens LEN covers the emission portion LEP through a minimum diameter of the lens LEN, a thickness of the OLED display can be prevented from increasing due to an increase in a size of the lens LEN. As a result, the manufacturing cost of the OLED display can be reduced. In some embodiments, the shape of the emission portion LEP is a polygon, and the shape of the lens LEN is a circle.

On the other hand, referring to FIG. 9, two or more lenses LEN may be disposed corresponding to the emission portion LEP of the organic light emitting diode. The two or more lenses LEN are disposed to cover the emission portion LEP of the organic light emitting diode. A sum of diameters L1 of the two or more lenses LEN may be equal to or greater than a width W1 of the emission portion LEP.

For example, as shown in (a) of FIG. 10, two lenses LEN may be disposed corresponding to one emission portion LEP. Alternatively, as shown in (b) of FIG. 10, four lenses LEN may be disposed corresponding to one emission portion LEP. FIG. 10 merely illustrates examples of the present disclosure, and thus the number and the arrangement of lenses may be variously changed. In some embodiments, the shape of the emission portion LEP is a polygon, and the shape of the lens LEN is a circle.

As shown in FIG. 9, light emitted from an emission layer EML is extracted to the outside through a predetermined light path LP. For example, light emitted from the emission layer EML is upwardly refracted at an interface between a left lens LEN and a passivation layer PCL due to a difference between a high refractive index of the left lens LEN and a low refractive index of the passivation layer PCL and then travels toward the inside of the passivation layer PCL. The light traveling toward the inside of the passivation layer PCL is refracted to the right at an interface between a right lens LEN and the passivation layer PCL due to a difference between a high refractive index of the right lens LEN and the low refractive index of the passivation layer PCL and then travels toward the inside of the lens LEN. Subsequently, the light traveling toward the inside of the lens LEN is upwardly refracted at an interface between the lens LEN and the passivation layer PCL due to a difference between the high refractive index of the lens LEN and the low refractive index of the passivation layer PCL and then is extracted. Thus, when the plurality of lenses is provided as described above, light emitted from the emission layer EML is upwardly refracted again compared to when one lens is provided. Hence, outcoupling efficiency can be further improved.

The second embodiment of the disclosure describes that the diameter of the lens is equal to the width of the emission portion, or the plurality of lenses is provided. As a result, the second embodiment of the disclosure can further improve the outcoupling efficiency through various configurations of the lenses.

Third Embodiment

Figure 11:
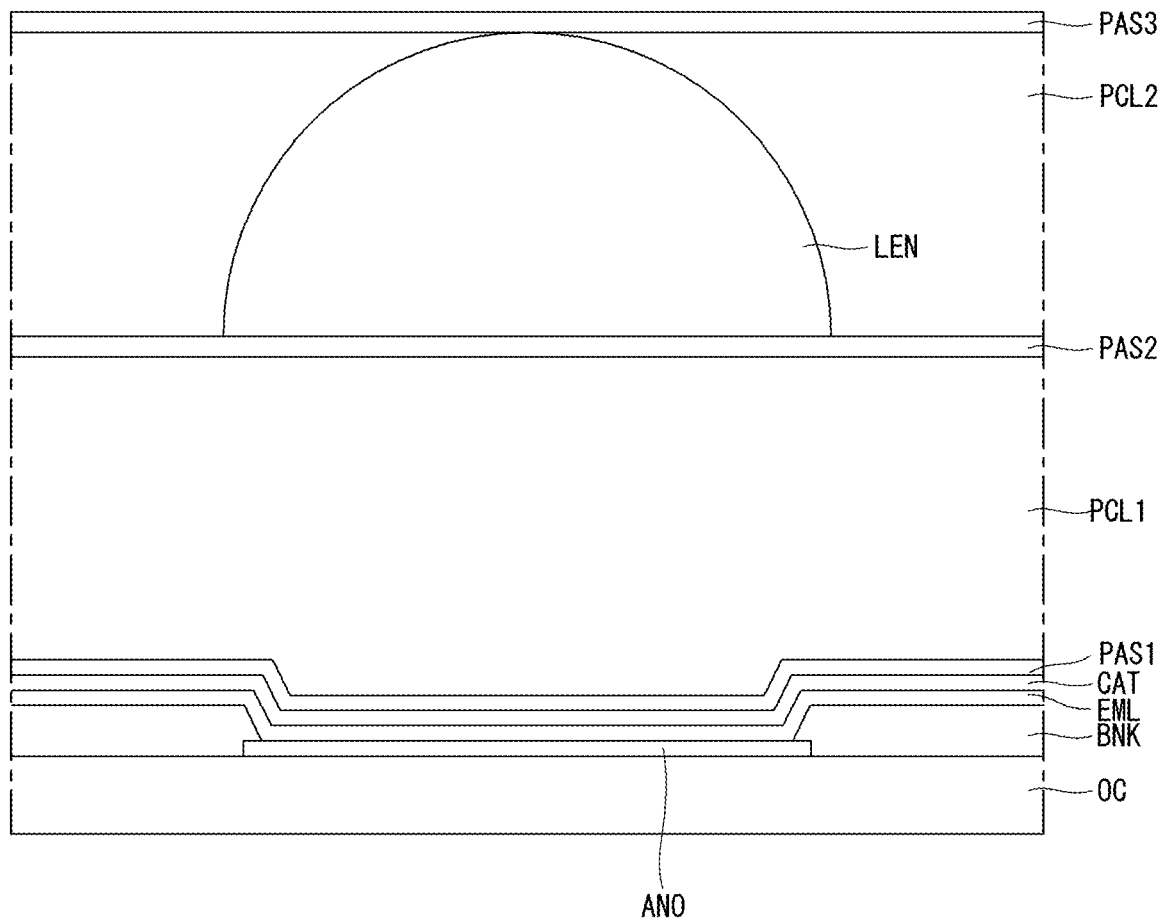
FIG. 11 is a cross-sectional view of an OLED display according to a third embodiment of the disclosure.

FIG. 11 is a cross-sectional view of an OLED display according to a third embodiment of the disclosure.

Referring to FIG. 11, a lamination structure of components laminated on a lens LEN in the third embodiment of the disclosure is different from that in the first and second embodiments.

More specifically, a first cover layer PCL1 is positioned on a first passivation layer PAS1. The first cover layer PCL1 functions to make up for a height difference of an underlying structure. For example, the first cover layer PCL1 can make up for a height difference resulting from foreign substances which may be present. A second passivation layer PAS2 is disposed on the first cover layer PCL1 and protects an underlying structure. The lens LEN is disposed on the second passivation layer PAS2, and a second cover layer PCL2 is disposed to include the lens LEN. A third passivation layer PAS3 is disposed on the second cover layer PCL2 and protects an underlying structure.

The lens LEN according to the third embodiment of the disclosure is disposed on the first cover layer PCL1 and the second passivation layer PAS2 and thus can prevent an organic light emitting diode from being damaged in a process for manufacturing the lens LEN. Further, because the first cover layer PCL1 makes up for the height difference resulting from foreign substances which may be present, the first cover layer PCL1 can prevent the lens LEN from being formed at the foreign substances and can improve outcoupling efficiency.

A method of manufacturing the OLED display according to the embodiments of the disclosure is described below using the OLED display according to the first embodiment of the disclosure as an example.

FIGS. 12 to 17 are cross-sectional views illustrating in stages a method of manufacturing the OLED display according to the first embodiment of the disclosure.

Figure 12:
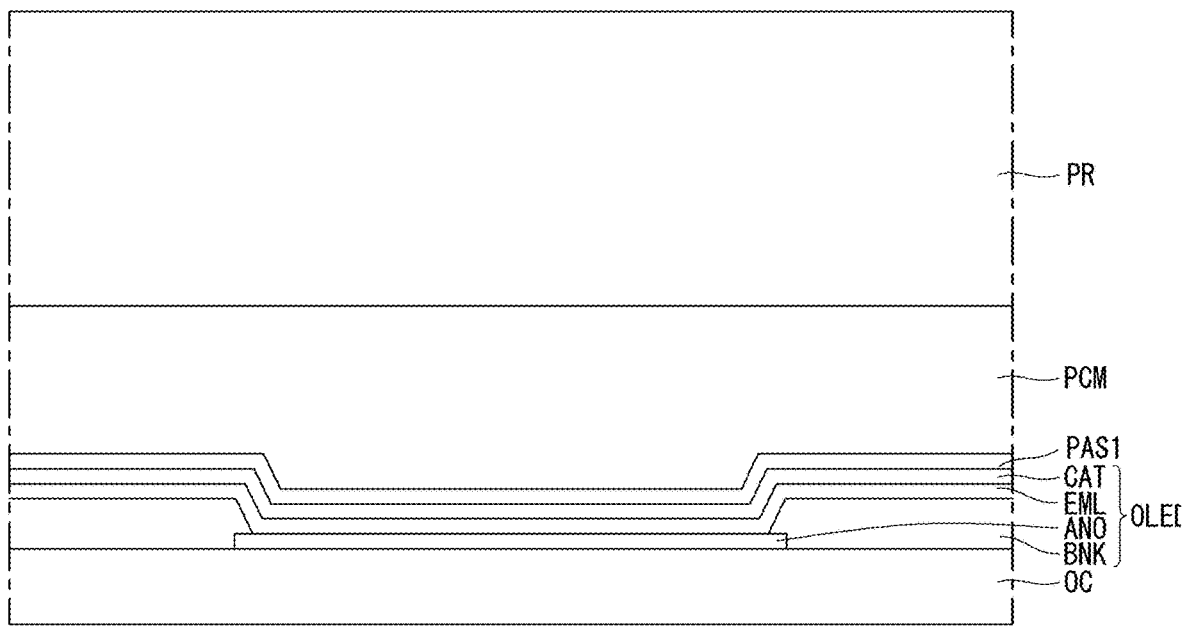
FIGS. 12 to 17 are cross-sectional views illustrating in stages a method of manufacturing an OLED display according to a first embodiment of the disclosure.

Referring to FIG. 12, an organic light emitting diode OLED is formed on an overcoat layer OC. More specifically, a first electrode ANO serving as a reflective electrode is positioned on the overcoat layer OC, and an organic material such as polyimide, benzocyclobutene-based resin, and acrylate is coated on the first electrode ANO to form a bank layer BNK. An emission layer EML is deposited on the bank layer BNK, and magnesium (Mg), calcium (Ca), aluminum (Al), silver (Ag), or a combination thereof each having a low work function is deposited on the emission layer EML to form a second electrode CAT.

Next, a silicon oxide (SiOx) layer, a silicon nitride (SiNx) layer, or a multilayer thereof is deposited on the second electrode CAT to form a first passivation layer PAS1. An organic material such as polyimide, benzocyclobutene-based resin, and acrylate is coated on the first passivation layer PAS1 to form a coating layer PCM. The coating layer PCM may use known materials in addition to the above-described materials. A photoresist PR is coated on the coating layer PCM.

Figure 13:
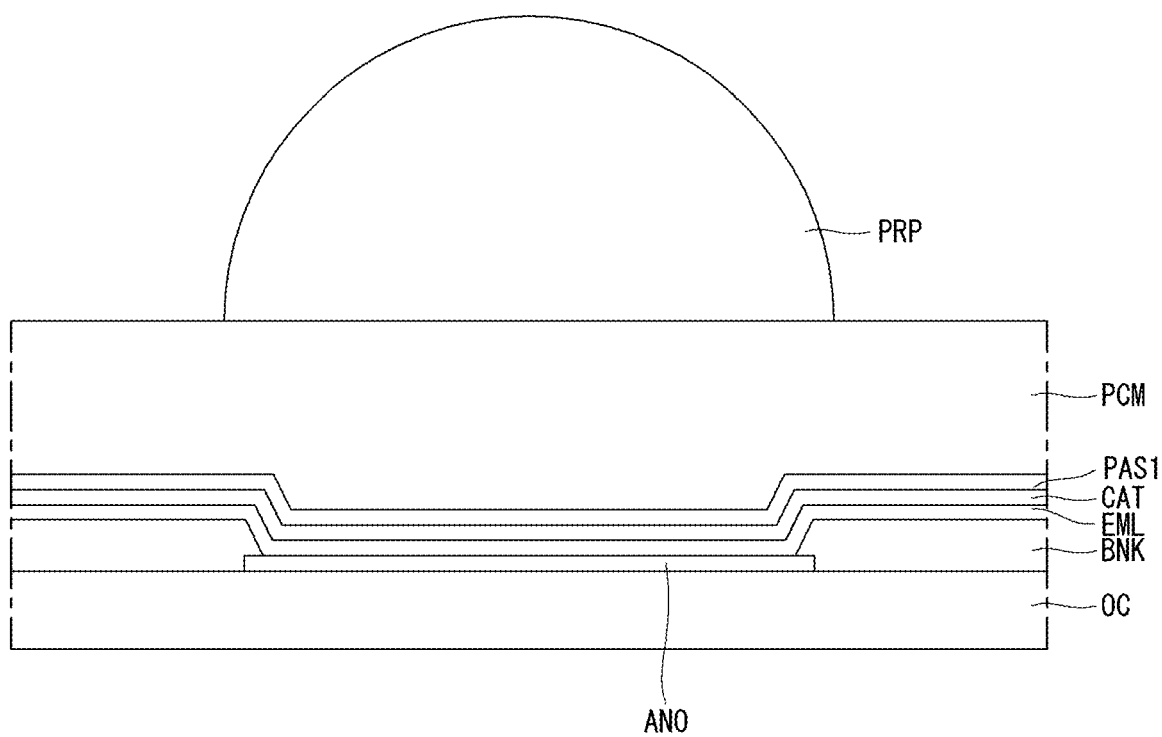
Figure 14:
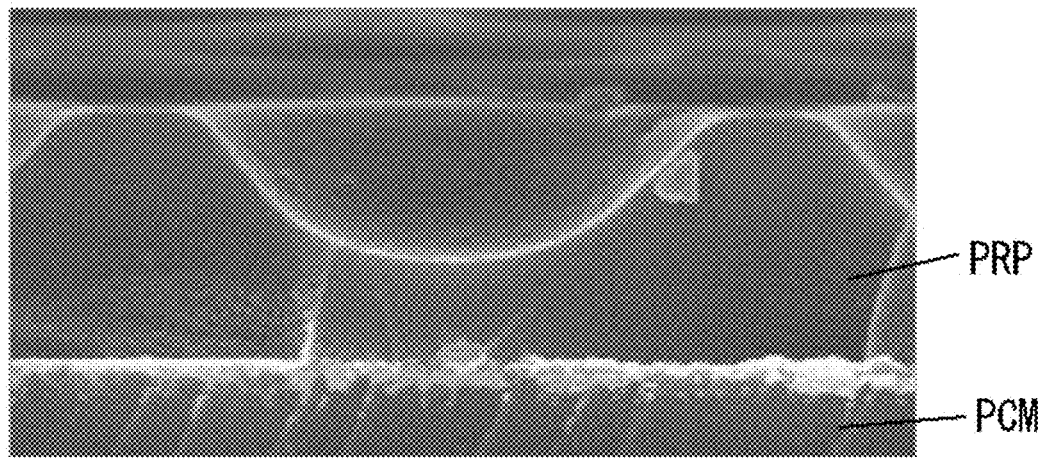

Next, referring to FIG. 13, the photoresist PR is developed in a shape of a lens to be formed. Thus, a photoresist pattern PRP of the lens shape is formed as in a scanning electron microscope (SEM) photograph of FIG. 14.

Figure 15:
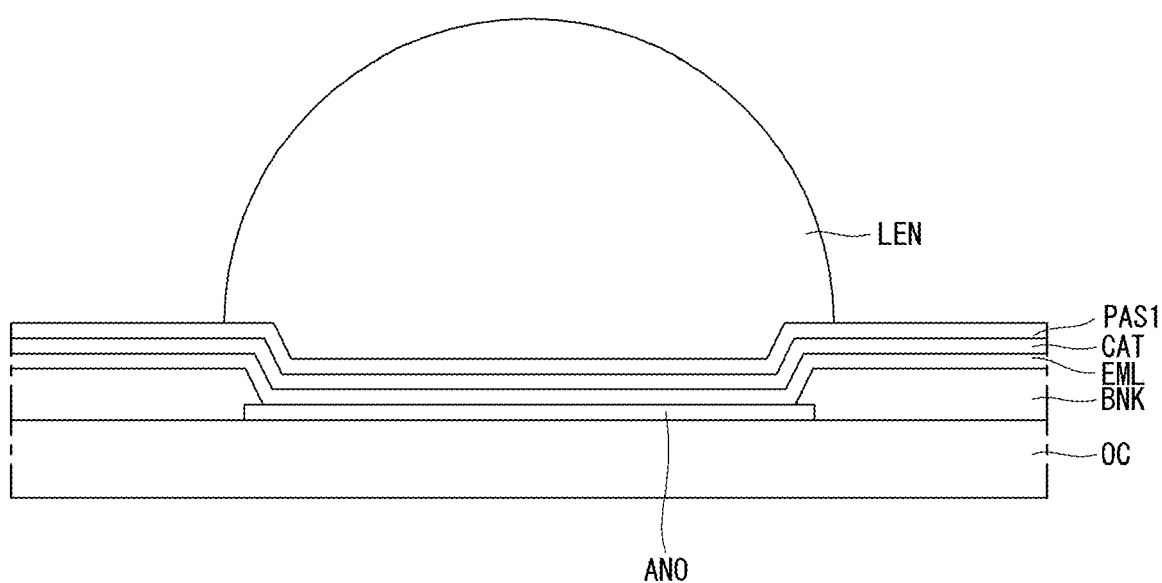
Figure 16:
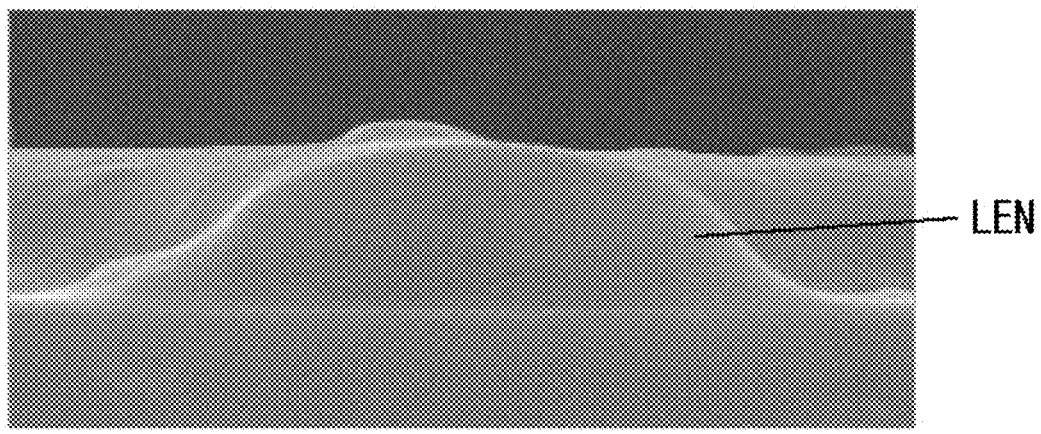

Next, referring to FIG. 15, the coating layer PCM is etched using the developed photoresist pattern PRP, and the photoresist pattern PRP is removed, thereby forming a lens LEN. Thus, the lens LEN is formed as in a SEM photograph of FIG. 16.

Figure 17:
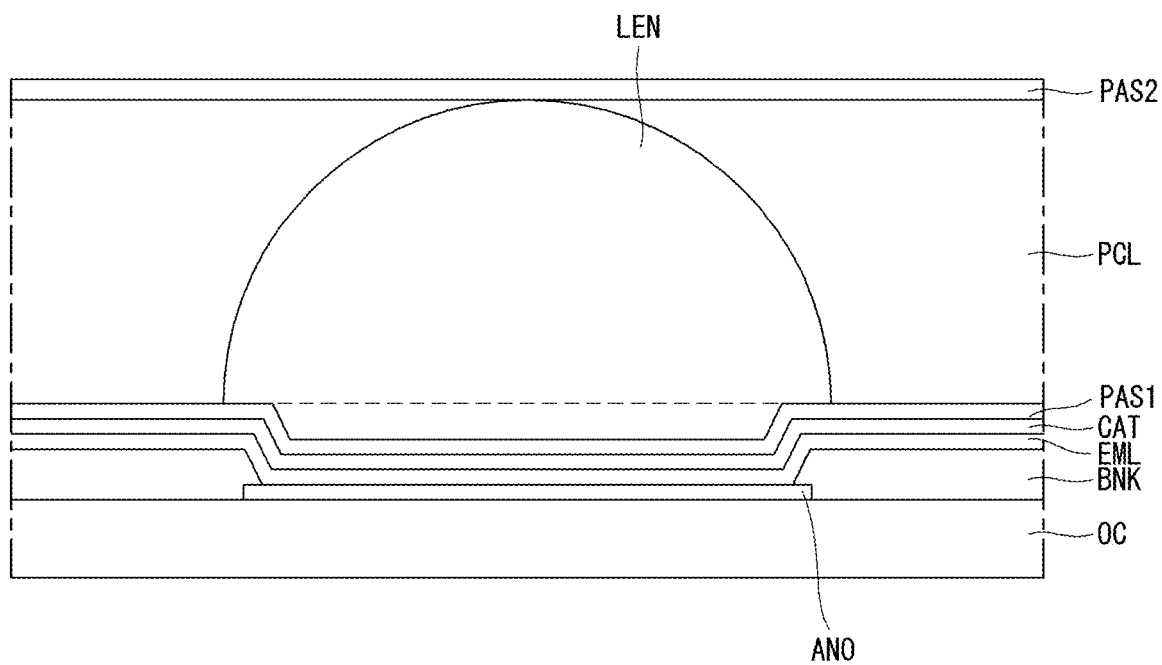

Next, referring to FIG. 17, an organic material such as polyimide, benzocyclobutene-based resin, and acrylate is coated on the first passivation layer PAS1, on which the lens LEN is formed, to form a cover layer PCL. In this instance, a formation material of the lens LEN and a formation material of the cover layer PCL have different refractive indexes, and a refractive index of the lens LEN is greater than a refractive index of the cover layer PCL.

Finally, a silicon oxide (SiOx) layer, a silicon nitride (SiNx) layer, or a multilayer thereof is deposited on the cover layer PCL to form the first passivation layer PAS1. As a result, the OLED display according to the embodiments of the disclosure is manufactured.

Figure 18:
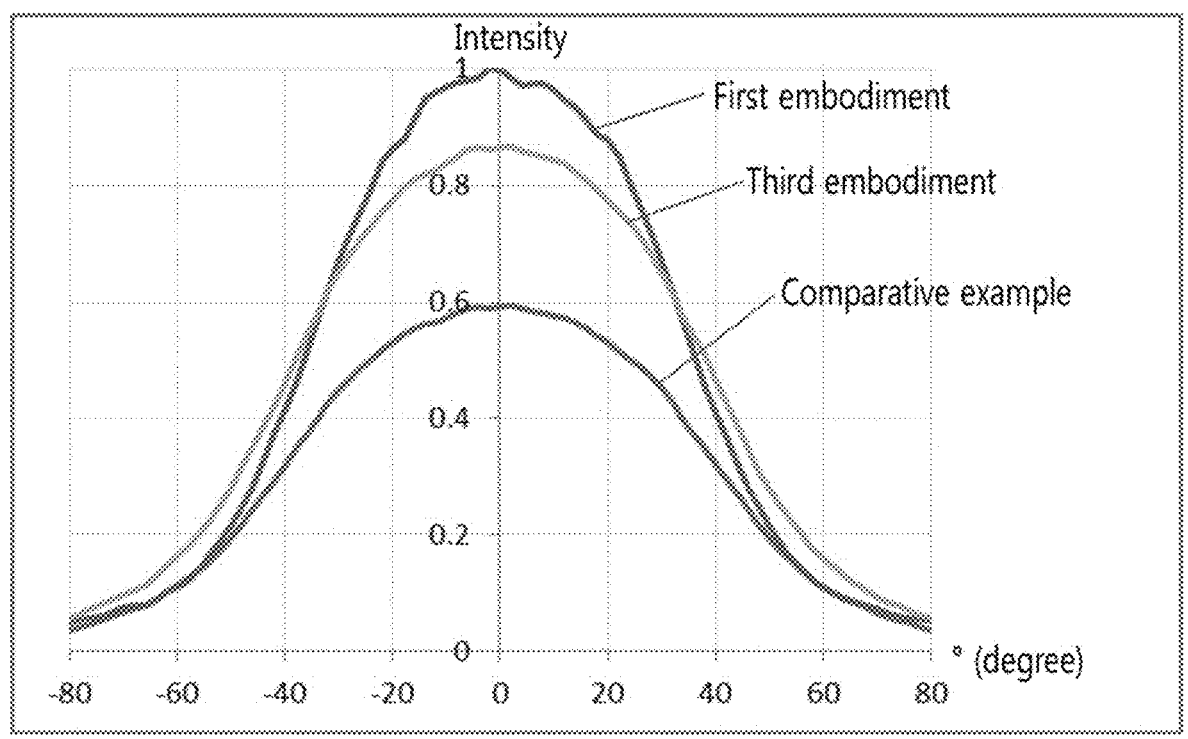
FIG. 18 is a graph illustrating an emission intensity depending on a viewing angle in OLED displays manufactured according to a comparative example and a first embodiment and a third embodiment of the disclosure.

FIG. 18 is a graph illustrating an emission intensity depending on a viewing angle in OLED displays manufactured according to a comparative example and the first embodiment and the third embodiment of the disclosure. In FIG. 18, the comparative example has a structure in which the lens is removed in the OLED display according to the first embodiment of the disclosure.

Referring to FIG. 18, an emission intensity of the OLED display not including the lens in accordance with the comparative example was about 0.6. On the other hand, an emission intensity of the OLED display including the lens in accordance with the first embodiment of the disclosure was about 1.0. Further, an emission intensity of the OLED display further including the cover layer below the lens in accordance with the first embodiment of the disclosure was about 0.85.

It could be seen from the graph of FIG. 18 that the emission intensity was improved by an outcoupling effect when the lens was included in the OLED display.

As described above, the OLED display according to the embodiments of the disclosure includes the lens corresponding to the emission portion on the organic light emitting diode and upwardly refracts light emitted from the emission layer through the lens, thereby improving the outcoupling efficiency.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a substrate;
   a subpixel arranged on the substrate, the subpixel including an organic light emitting diode having an emission portion that emits light;
   a first passivation layer disposed on the organic light emitting diode;

at least one lens positioned on the first passivation layer, the at least one lens disposed in a position corresponding to the emission portion of the organic light emitting diode;
a cover layer covering the at least one lens, wherein the cover layer is in contact with a side portion of the at least one lens; and
a second passivation layer disposed on the cover layer, wherein the at least one lens is in contact with the second passivation layer,
wherein a top portion of the at least one lens is exposed through the cover layer, and
wherein the top portion of the at least one lens exposed through the cover layer is in contact with the second passivation layer.

2. The display device of claim 1, wherein the organic light emitting diode includes:
a first electrode;
an emission layer disposed on the first electrode; and
a second electrode disposed on the emission layer.

3. The display device of claim 2, wherein the first electrode is in contact with the emission layer in the emission portion.

4. The display device of claim 2, wherein the first passivation layer is in contact with the second electrode, and the at least one lens is in contact with the first passivation layer.

5. The display device of claim 1, wherein the at least one lens overlaps the emission portion in its entirety.

6. The display device of claim 1, wherein a diameter of the at least one lens is equal to or greater than a width of the emission portion.

7. The display device of claim 1, wherein a height of the at least one lens is equal to or less than a diameter of the at least one lens.

8. The display device of claim 1, wherein a refractive index of the at least one lens is greater than a refractive index of the cover layer.

9. The display device of claim 1, wherein the at least one lens includes a first portion in which the at least one lens and the emission portion overlap, and a second portion in which the at least one lens and the emission portion do not overlap.

10. The display device of claim 9, wherein the second portion is disposed around the emission portion.

11. The display device of claim 9, wherein the second portion surrounds the emission portion.

12. A display device comprising:
a substrate;
a subpixel arranged on the substrate, the subpixel including an organic light emitting diode having an emission portion that emits light;
a first passivation layer on the organic light emitting diode;
a plurality of lenses positioned on the organic light emitting diode, the plurality of lenses overlapping the emission portion of the subpixel in its entirety;
a second passivation layer on the plurality of lenses; and
a first cover layer on the plurality of lenses, wherein the first cover layer is in contact with a side portion of the plurality of lenses,
wherein a top portion of each of the plurality of lenses is exposed through the first cover layer, and
wherein the top portion of each of the plurality of lenses exposed through the first cover layer is in contact with the second passivation layer.

13. The display device of claim 12, wherein the organic light emitting diode includes:
a first electrode;
an emission layer disposed on the first electrode, wherein the first electrode is in contact with the emission layer in the emission portion; and
a second electrode disposed on the emission layer.

14. The display device of claim 12, wherein a sum of diameters of the plurality of lenses is equal to or greater than a width of the emission portion.

15. The display device of claim 12, wherein a height of at least one of the plurality of lenses is equal to or less than a diameter of the plurality of lenses.

16. The display device of claim 12, wherein a refractive index of the plurality of lenses is greater than a refractive index of the first cover layer.

17. The display device of claim 12,
wherein the plurality of lenses are between the first passivation layer and the second passivation layer.

18. The display device of claim 12, further comprising:
a second cover layer on the first passivation layer; and
a third passivation layer on the second cover layer,
wherein the plurality of lenses are between the second passivation layer and the third passivation layer.

19. The display device of claim 12, wherein the plurality of lenses include a first portion in which the plurality of lenses and the emission portion overlap, and a second portion in which the plurality of lenses and the emission portion do not overlap.

20. The display device of claim 19, wherein the emission portion includes a third portion in which the plurality of lenses and the emission portion overlap, and a fourth portion in which the plurality of lenses and the emission portion do not overlap.

21. The display device of claim 20, wherein the first portion of the plurality of lenses overlaps the third portion of the emission portion.

22. A display device comprising:
a plurality of pixels that each include a plurality of sub-pixels, each of the plurality of sub-pixels of at least one pixel including:
an emission portion that emits light;
a first passivation layer disposed on the emission portion;
at least one lens that overlaps the emission portion and comprises a diameter that is at least as wide as a width of the emission portion, wherein a shape of the emission portion in a plan view of the display device is a polygon and a shape of the at least one lens in the plan view is a circle;
a cover layer covering the at least one lens, wherein the cover layer is in contact with a side portion of the at least one lens; and
a second passivation layer disposed on the cover layer, wherein the cover layer is in contact with a side portion of the at least one lens,
wherein a top portion of the at least one lens is exposed through the cover layer, and
wherein the top portion of the at least one lens exposed through the cover layer is in contact with the second passivation layer.

23. The display device of claim 22, wherein a first subset of the plurality of sub-pixels of at least one pixel is arranged in a first row of sub-pixels and a second subset of the plurality of sub pixels of the at least one pixel is arranged in a second row of sub-pixels that is adjacent to the first row.

24. The display device of claim 22, wherein the plurality of sub-pixels of at least one pixel are arranged in a single row of sub-pixels.

25. The display device of claim 22, wherein the at least one lens includes a first portion in which the at least one lens and the emission portion overlap, and a second portion in which the at least one lens and the emission portion do not overlap.

26. The display device of claim 25, wherein the second portion is disposed around the emission portion.

27. The display device of claim 25, wherein the second portion surrounds the emission portion.

* * * * *